United States Patent

[11] 3,617,855

[72] Inventor Chosaku Hisatsu
Chigasaki, Japan

[21] Appl. No. 74,809
[22] Filed Sept. 23, 1970
[45] Patented Nov. 2, 1971
[73] Assignee Nippon Oceanics Institute, Ltd.
Katase, Fujisawa City, Japan
[32] Priority Apr. 24, 1970
[33] Japan
[31] 45/34930

[54] PHASE-DETECTING CIRCUITS
2 Claims, 5 Drawing Figs.

[52] U.S. Cl. .......... 321/51, 307/262, 324/119, 330/69
[51] Int. Cl. .......... H02m 5/00, H03f 21/00
[50] Field of Search .......... 307/236, 232, 262; 321/51, 47; 324/83, 119; 330/69

[56] References Cited

UNITED STATES PATENTS

| | | | |
|---|---|---|---|
| 3,292,098 | 12/1966 | Bensing | 307/262 X |
| 3,432,650 | 3/1969 | Thompson | 330/69 |
| 3,526,786 | 9/1970 | Snyder | 330/69 X |
| 3,564,430 | 2/1971 | Brudevold | 307/262 X |

FOREIGN PATENTS

| | | | |
|---|---|---|---|
| 616,626 | 2/1961 | Italy | 330/69 |

*Primary Examiner*—William M. Shoop, Jr.
*Attorney*—Chittick, Pfund, Birch, Samuels & Gauthier

ABSTRACT: A circuit for detecting the phase of an AC input signal comprises first and second differential amplifiers connected in parallel, means to render the first and second differential amplifiers ON and OFF with a phase difference of 180° in response to the AC input signal, and a third differential amplifier which compares outputs from the first and second differential amplifiers to provide a DC output having a polarity related to the phase of the AC input signal.

INVENTOR.
CHOUSAKU HISATSU
BY Chittick, Pfund, Birch, Samuels & Gauthier

INVENTOR.
CHOUSAKU HISATSU
BY Chittick, Pfund, Birch, Samuels & Gauthier

PHASE-DETECTING CIRCUITS

BACKGROUND OF THE INVENTION

This invention relates to a novel phase-detecting circuit.

SInce the prior art phase-detecting circuit utilizes transformers and the like it has been impossible to miniaturize the circuit. More particularly, it has been difficult to construct the phase-detecting circuit in the form as an integrated circuit.

SUMMARY OF THE INVENTION

The object of this invention is to provide a novel phase-detecting circuit in the form of an integrated circuit.

More specific object of this invention is to provide a compact phase-detecting circuit comprised solely by transistors and resistors which can be readily fabricated as an integrated circuit of miniature size.

According to this invention there is provided a phase-detecting circuit comprising a first differential amplifier, a second differential amplifier connected in parallel with the first differential amplifier, means to render the first and second differential amplifiers ON and OFF with a phase difference of 180° in response to an AC input signal, and a third differential amplifier which compares outputs from the first and second differential amplifiers to provide a DC output having a polarity related to the phase of the AC input signal.

DESCRIPTION OF THE PREFERRED EMBODIMENTS

Figures 1, 3:
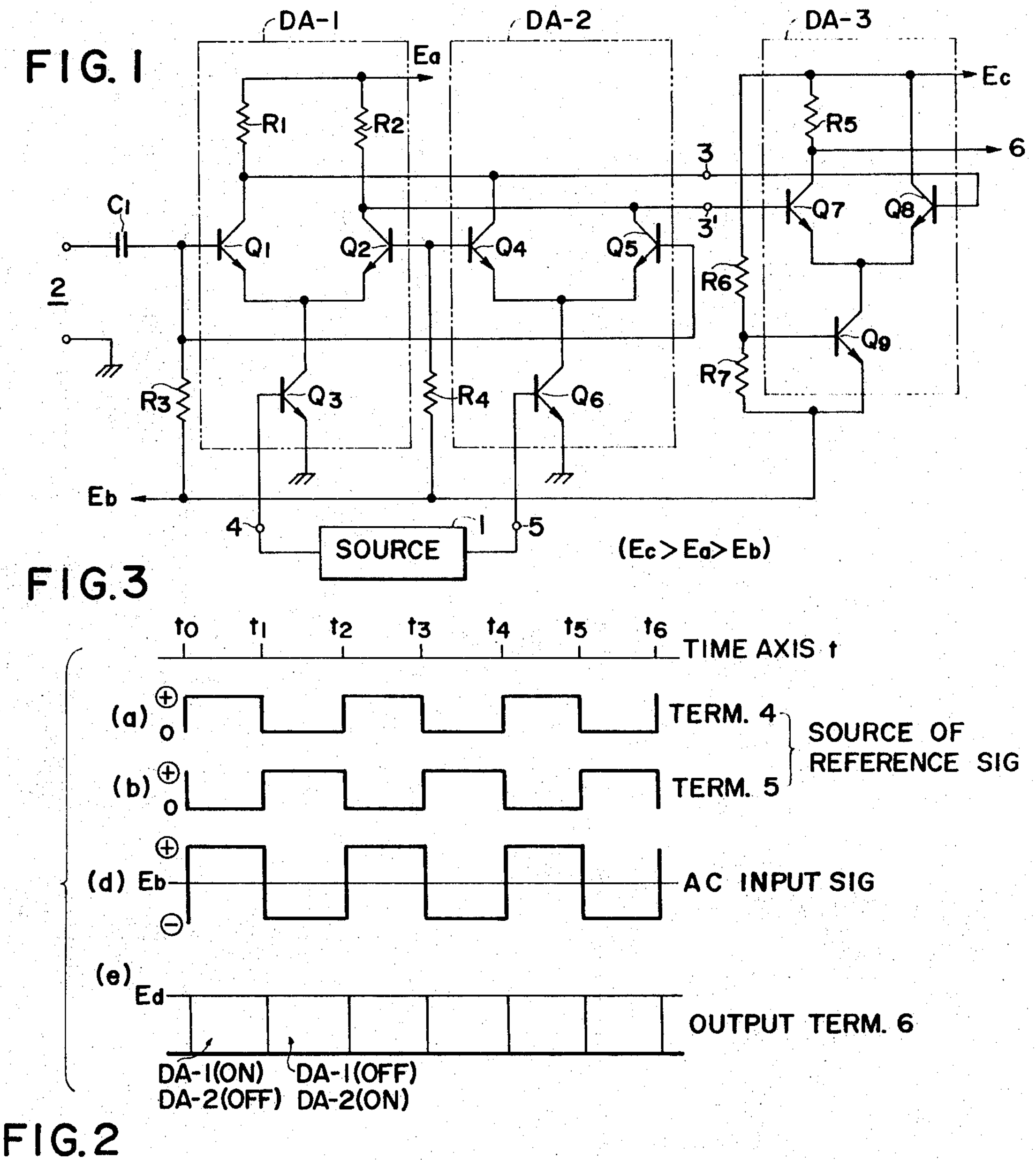
FIG. 1 is a connection diagram of a phase-detecting circuit embodying this invention.
FIGS. 2 to 4 show waveforms to explain the operation of the novel phase-detecting circuit.
Figure 2:
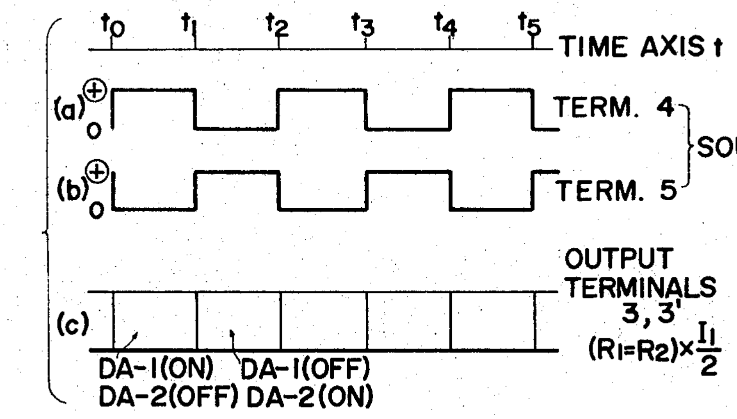

FIG. 1 shows a basic embodiment of the phase-detecting circuit of this invention comprising three differential amplifiers DA–1, DA–2 and DA–3 and provides dual function of phase detection and amplification. As shown, the differential amplifier DA–1 comprises transistors $Q_1$, $Q_1$ and $Q_3$, differential amplifier DA–2 transistors $Q_4$, $Q_5$ and $Q_6$ and differential amplifier transistors $Q_7$, $Q_8$and $Q_9$, respectively. Differential amplifiers DA-1 and DA–2 cooperate to effect phase detection while differential amplifier DA–3 acts as a comparator. A reference signal is supplied to differential amplifiers DA–1 and DA–2 from a source 1 and the output from source 1 is supplied to the base electrodes of transistor $Q_3$ and $Q_6$ in these differential transformers DA–1 and DA–2 as the base bias signal to cause these transistors to act as constant current sources. An input AC signal supplied to an input terminal 2 is coupled to the base electrodes of transistors $Q_1$ and $Q_5$ comprising differential amplifiers through a coupling capacitor $C_1$. Collector electrodes of transistors $Q_1$ and $Q_4$ and those of transistors $Q_2$ and $Q_4$ are connected in common, respectively. Similarly, base electrodes of transistors $Q_1$ and $Q_5$ and those of transistors $Q_2$ and $Q_4$ are also connected in common, respectively. Base electrodes connected in common are connected to a source of bias potential Eb respectively through resistors $R_3$ and $R_4$ having equal values. Resistors $R_1$ and $R_2$ comprise the common load resistor of differential amplifiers DA–1 and DA–2 with resistor $R_1$ connected to the collector electrodes of transistors $Q_1$ and $Q_4$ and resistor $R_2$ to collector electrodes of transistors $Q_2$ and $Q_5$. Resistors $R_1$ and $R_2$ have equal values.

In this embodiment, the source of reference signal 1 is an oscillator supplying to terminals 4 and 5 reference signals having the same frequency but dephased 180° from each other, the frequency being equal to that of the AC signal impressed upon the input terminal 2. Accordingly, in the absence of the input AC signal at the input terminal 2, signal voltages shown in FIGS. *2l* and *2b*, respectively, are applied to terminals 4 and 5 of the source of reference signal 1 so that during the interval between $t_0$ and $t_1$ along the time axis $t$, transistors $Q_1$, $Q_2$ and $Q_3$ of the differential amplifier DA–1 become ON as shown in FIG. *2c*, whereas transistors $Q_4$, $Q_5$ and $Q_6$ of differential amplifier DA–2 are maintained in their OFF state. During this interval, a common mode current I flows through transistor $Q_3$, whereas one-half of the common mode current $I_1$ flows through transistors $Q_1$ and $Q_2$ respectively so that voltage drops across resistors $R_1$ and $R_2$ are equal. For this reason, no potential difference appears across output terminals 3 and 3′. Thus, the comparator differential amplifier DA–3 does not operate because there is no potential difference between base electrodes of transistors DA–3.

During the interval between $t_1$ and $t_2$ only transistors $Q_4$, $Q_5$ and $Q_6$ of differential amplifier DA–2 become ON and transistors $Q_1$, $Q_2$ and $Q_3$ of differential amplifier DA–1 are in their OFF state. Thus, differential amplifier DA–2 operates in the same manner as differential amplifier DA–1 thereby producing no voltage difference across output terminals 3 and 3′. In this manner, the voltage alone caused by the common mode current $I_1$ flowing through load resistors $R_1$ and $R_2$ appears across output terminals 3 and 3′. Differential amplifier DA–3 is supplied with a bias voltage corresponding to the difference between the source voltage E*a* and the voltage drop across load resistors $R_1$ and $R_2$ caused by the current one-half of the common mode current $I_1$ of differential amplifier DA–1 and DA–2. As a consequence, common load current $I_2$ flows through differential amplifier DA–3 via transistor $Q_9$so that a voltage drop equal to $I_2/2 \times R_5$ is created across load resistor $R_5$ to provide a collector potential $Ec - I_2 12 \cdot R_5$ for transistor $Q_7$. For the sake of description this collector potential is taken as a reference voltage E*d*.

When an AC input signal shown by FIG. *3d* and having a phase relationship with respect to reference signal voltages (FIGS. *3a* and *3b*) at terminals 4 and 5 arrives at input terminal 2, during the interval between $t_0$ and $t_1$ differential amplifier DA–1 becomes ON whereas differential amplifier DA–2 becomes OFF. Under these circumstances, differential amplifier DA–1 operates as an amplifier to increase the collector current thereof since input signal (FIG. *3d*) applied upon the commonly connected base electrodes of transistors $Q_1$ and $Q_5$ from the terminal 2 via coupling capacitor $C_1$ has increased in the positive direction from the bias voltage E*b*. Concurrently therewith, the voltage drop across load resistor $R_1$ increases to decrease the collector potential of transistor $Q_1$. For this reason, collector current of transistor $Q_2$ decreases by an amount equal to the increase in the current through transistor $Q_1$ to decrease the voltage drop across load resistor $R_2$. Thus, the collector potential of transistor $Q_2$ increases. Consequently, a voltage equal to the decrease in the collector potential of transistors $Q_1$ and $Q_4$ appears at the collector output terminal 3 of these transistors whereas a voltage equal to the increase in the collector potential of transistor $Q_2$ appears at output terminal 3′ of transistor $Q_2$ and $Q_5$. In this manner, as the base potential of transistor $Q_7$ of differential amplifier DA–3 increases and as the base potential of transistor $Q_8$ decreases a differential potential is created to increase the collector current of transistor $Q_7$ and decrease the collector current of transistor $Q_8$. Owing to this action, the voltage drop across load resistor $R_5$ increases to a value less that the reference voltage E*d*.

During the interval $t_1$ and $t_2$, FIG. 3, transistor $Q_4$, $Q_5$ and $Q_6$ of differential amplifier DA–2 becomes ON and transistors $Q_1$, $Q_2$ and $Q_3$ of differential amplifier DA–1 becomes OFF. As a consequence, only differential amplifier DA–2 operates as an amplifier. Under these circumstances, input AC signal shown in FIG. *3d*decreases in the negative direction with respect to the bias voltage E*b* and this decreased voltage is impressed upon the commonly connected base electrodes of transistors $Q_1$ and $Q_5$ of differential amplifiers DA–1 and DA–2 As a result, the collector current of transistor $Q_5$ decreases to decrease the voltage drop across load resistor $R_2$ thus increasing the collector potential of transistor $Q_5$. This also decreases the emitter potential of transistor $Q_5$ to increase the bias potential of transistor $Q_4$ in the forward direction to decrease the potential of the commonly connected collector electrodes of transistors $Q_1$ and $Q_4$ by an amount corresponding to the current controlled by transistor $Q_5$.

Owing to the operation described above, a potential corresponding to the decrease in the collector potential of transistors $Q_1$ and $Q_4$ appears at output terminal 3 and a potential corresponding to the increase in the collector potential of transistors $Q_2$ and $Q_5$ appears at output terminal 3'. As a consequence, a differential potential appears at the input of differential amplifier DA-3 thus creating a potential difference of the same potential as the output from differential amplifier thus increasing the voltage drop across load resistor $R_5$ to produce a voltage less than the reference voltage E*d*. As a result, a DC voltage as shown in FIG. 3*e* appears at the output terminal 6 of the differential amplifier DA–3. In other words, the phase-detecting circuit operates just like a fullwave rectifier.

Figure 4:
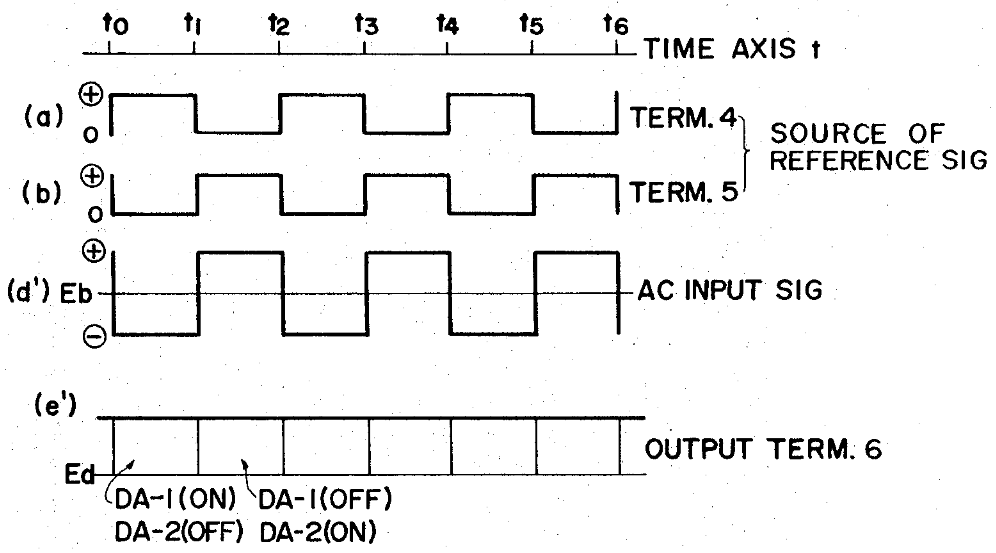

In the case shown in FIG. 4, an AC input signal shown in FIG. 4*d'* and applied to input terminal 2 has a polarity just opposite to the input signal applied in the case of FIG. 3. When the AC input signal *d'* is applied to input terminal 2 (FIG. 1) and reference voltages shown in FIGS. 4*l* and 4*b* are impressed upon terminals 4 and 5, respectively, an operation just opposite to that of the case shown in FIG. 3 results to provide an output voltage (FIG. 4*e'*) which is positive with respect to the reference voltage E*d* at the output terminal 6 of differential amplifier DA–3. By comparing FIG. 3 with FIG. 4 it will be noted that the circuit shown in FIG. 1 produces a positive or negative output voltage at the output terminal 6 dependent upon the phase relationship between the AC input signal and the reference signal voltage, thus detecting the phase of the AC input signal.

Figure 5:
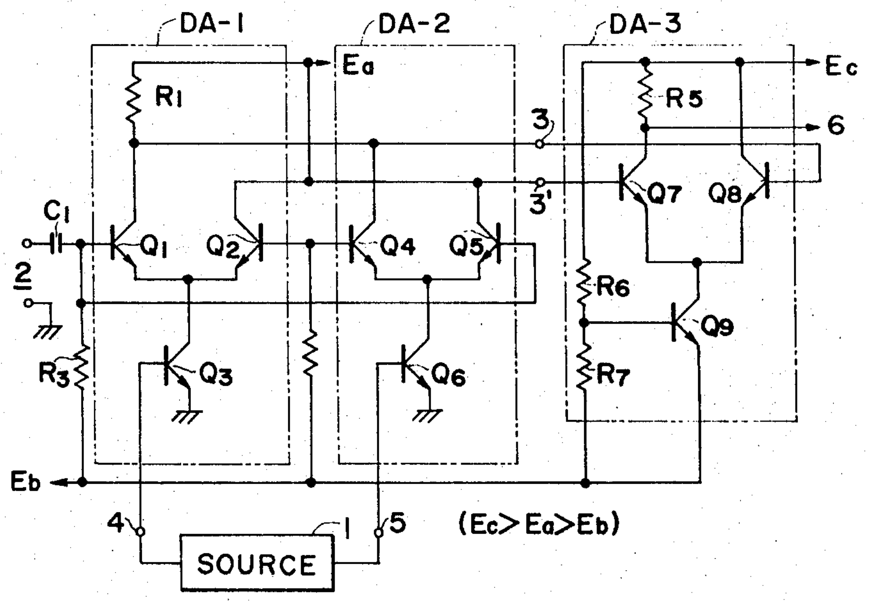
FIG. 5 is a connection diagram of a modified phase-detecting circuit embodying this invention.

While in the embodiment shown in FIG. 1, collector electrodes of transistors $Q_1$ and $Q_4$ are connected to the source through common resistor $R_1$ and collector electrodes of transistors $Q_2$ and $Q_5$ are connected to the source through common resistor $R_2$, it should be understood that either one of the resistors $R_1$ and $R_2$ may be omitted. FIG. 5 shows such a modification wherein resistor $R_2$ is omitted.

From the foregoing description it will be clear that this invention provides a novel phase-detecting circuit wherein first and second differential amplifiers are connected in parallel and are caused to become ON and OFF with a phase difference of 180° and the output from these differential amplifiers related to the phase of an input AC signal is compared by a third differential amplifier thus detecting the phase of the input AC signal and that no transformer is used. Moreover, the component parts of the novel circuit are comprised essentially by transistors and resistors it is easy to construct the circuit as an integrated circuit of extremely small size.

Although the invention has been shown and described in terms of certain preferred embodiments it will be clear that many changes and modifications may be made within the scope of the invention as defined in the appended claims.

What is claimed is:

1. A phase-detecting circuit comprising a first differential amplifier, a second differential amplifier connected in parallel with said first differential amplifier, means to render said first and second differential amplifiers ON and OFF with a phase difference of 180° in response to an AC input signal, and a third differential amplifier which compares outputs from said first and second differential amplifiers to provide a DC output having a polarity related to the phase of said AC input signal.

2. A phase-detecting circuit comprising first and second differential amplifiers connected in parallel; each of said differential amplifiers including parallely connected first and second transistors and a transistor connected in series with said first and second transistors; means to impress an AC input signal upon the first transistor of each differential amplifier; means to impress a reference voltage upon the second transistor of each differential transistor; means to impress AC reference voltages of the opposite phase upon the third transistor of said first and second differential amplifier; and a third differential amplifier including parallel connected transistors respectively responsive to the outputs from said first and second differential amplifiers to produce a DC output having a polarity related to the phase of said input AC signal.

* * * * *

PO-1050
(5/69)

UNITED STATES PATENT OFFICE
CERTIFICATE OF CORRECTION

Patent No. 3,617,855 Dated November 2, 1971

Inventor(s) Chosaku Hisatsu

It is certified that error appears in the above-identified patent and that said Letters Patent are hereby corrected as shown below:

Column 1, line 74, "in" should be -- by --.

Column 1, line 74, "21" should be -- 2a --.

Column 1, line 75, after "during" change "the" to -- an --.

Column 2, line 26, change "amplifier" to -- amplifiers --.

Column 2, line 30, change $Ec-I_2$ $12.R_5$" to -- $Ec-I_2/2.R5$ --.

Column 2, line 42, before "terminal" insert -- input --.

Column 2, line 61, change "that" to -- than --.

Column 2, line 63, change "transistor" to -- transistors --.

Column 3, line 23, change "41" to -- 4a --.

Column 4, line 10, after "Moreover" insert -- since --.

Signed and sealed this 30th day of May 1972.

(SEAL)
Attest:

EDWARD M.FLETCHER,JR.
Attesting Officer

ROBERT GOTTSCHALK
Commissioner of Patents